US010979252B1

(12) United States Patent
Fan et al.

(10) Patent No.: US 10,979,252 B1
(45) Date of Patent: Apr. 13, 2021

(54) DYNAMIC TRANSMITTER PROCESSING MODIFICATION

(71) Applicant: TEXAS INSTRUMENTS INCORPORATED, Dallas, TX (US)

(72) Inventors: Yanli Fan, Dallas, TX (US); Amit Rane, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/892,943

(22) Filed: Jun. 4, 2020

Related U.S. Application Data

(60) Provisional application No. 62/969,172, filed on Feb. 3, 2020.

(51) Int. Cl.
*H04L 25/02* (2006.01)
*H03G 3/30* (2006.01)
*H03F 3/72* (2006.01)

(52) U.S. Cl.
CPC ............ *H04L 25/0272* (2013.01); *H03F 3/72* (2013.01); *H03G 3/3042* (2013.01); *H04L 25/028* (2013.01); *H04L 25/0292* (2013.01)

(58) Field of Classification Search
CPC ............... H04L 25/0272; H04L 25/028; H04L 25/0292; H03G 3/3042; H03F 3/72

USPC .......................................................... 375/257
See application file for complete search history.

(56) References Cited

U.S. PATENT DOCUMENTS

| | | | |
|---|---|---|---|
| 6,377,082 B1 * | 4/2002 | Loinaz | H03K 5/19 327/156 |
| 10,014,965 B1 * | 7/2018 | Forey | H04B 17/21 |
| 2006/0129733 A1 * | 6/2006 | Sobelman | H04L 25/0262 710/305 |
| 2020/0350899 A1 * | 11/2020 | Huang | H03K 19/003 |

* cited by examiner

*Primary Examiner* — Ted M Wang
(74) *Attorney, Agent, or Firm* — John R. Pessetto; Charles A. Brill; Frank D. Cimino

(57) ABSTRACT

Aspects of the disclosure provide for a circuit comprising a transmitter. In at least some examples, the transmitter is configured to receive an input signal and a loss of signal indication signal. The transmitter is further configured to dynamically modify processing of the input signal based on the loss of signal indication signal. The transmitter modifies processing of the input signal based on the loss of signal indication signal by processing the input signal via a limiting driver signal path to generate an output signal when the loss of signal indication signal has a first value and processing the input signal via a linear driver signal path to generate the output signal when the loss of signal indication signal has a second value.

20 Claims, 2 Drawing Sheets

DYNAMIC TRANSMITTER PROCESSING MODIFICATION

CROSS-REFERENCE TO RELATED APPLICATIONS

The present application claims priority to U.S. Provisional Patent Application No. 62/969,172, which was filed Feb. 3, 2020, is titled "Error Free Design for Mode Transitioning in USB and USB-C," and is hereby incorporated herein by reference in its entirety.

SUMMARY

At least some aspects of the disclosure provide for a circuit. In at least some examples, the circuit includes a loss of signal detection circuit and a transmitter coupled to the loss of signal detection circuit. The loss of signal detection circuit is configured to receive an input signal, determine whether the input signal includes data, and output a loss of signal indication signal indicating whether the input signal includes data. The transmitter is configured to receive the input signal, process the input signal according to a limiting driver signal path to generate an output signal when the loss of signal indication signal indicates that the input signal includes data, and process the input signal according to a linear driver signal path to generate the output signal when the loss of signal indication signal indicates that the input signal does not include data.

Other aspects of the disclosure provide for a circuit comprising a transmitter. In at least some examples, the transmitter is configured to receive an input signal and a loss of signal indication signal. The transmitter is further configured to dynamically modify processing of the input signal based on the loss of signal indication signal. The transmitter modifies processing of the input signal based on the loss of signal indication signal by processing the input signal via a limiting driver signal path to generate an output signal when the loss of signal indication signal has a first value and processing the input signal via a linear driver signal path to generate the output signal when the loss of signal indication signal has a second value.

Other aspects of the disclosure provide for a method. In at least some examples, the method comprises receiving an input signal and a loss of signal indication signal and dynamically modifying processing of the input signal based on the loss of signal indication signal. To dynamically modify processing of the input signal based on the loss of signal indication signal method further comprises processing the input signal via a limiting driver signal path to generate an output signal when the loss of signal indication signal has a first value and processing the input signal via a linear driver signal path to generate the output signal when the loss of signal indication signal has a second value.

BRIEF DESCRIPTION OF THE DRAWINGS

For a detailed description of various examples, reference will now be made to the accompanying drawings in which.

DETAILED DESCRIPTION

Figure 1:
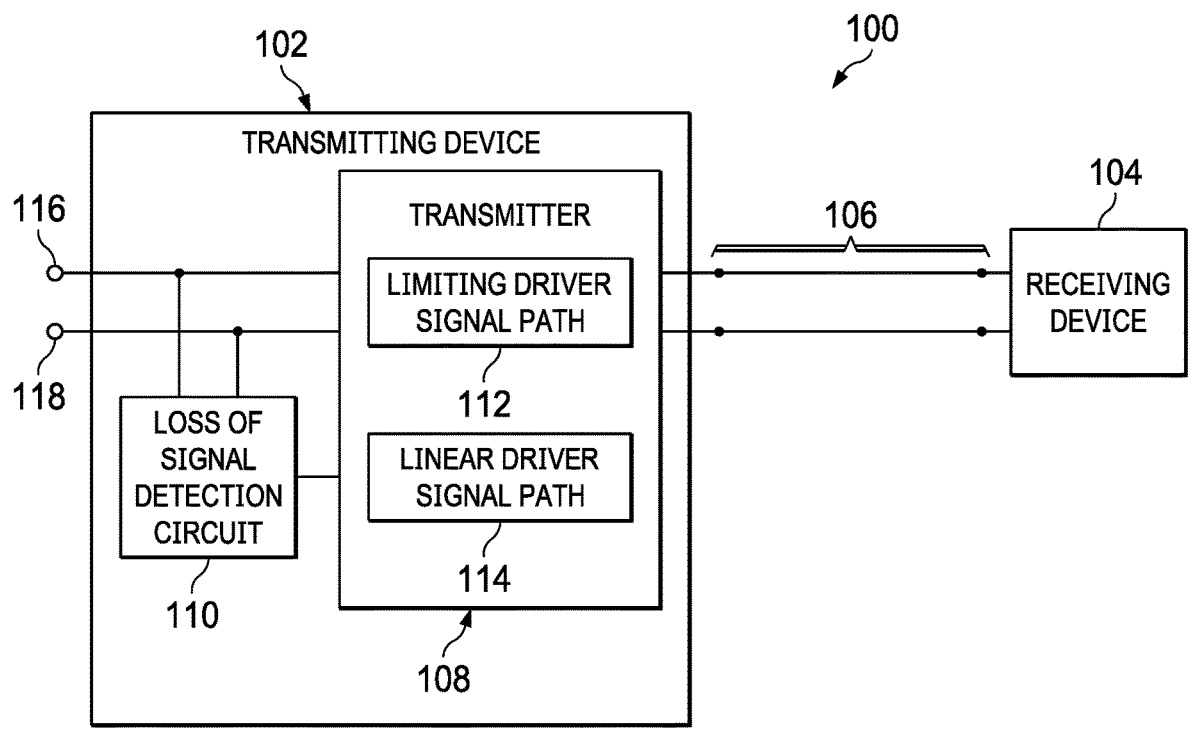
FIG. 1 shows a block diagram of an illustrative system in accordance with various examples.

Communications devices often include a transmitter that includes an amplifier or driver for use in transmitting signals. Therefore, the transmitter amplifies a magnitude of a received input signal prior to transmitting that amplified signal as an output signal. When the communication device communicates according to a protocol that has multiple modes or states, at least some protocols place limitations on signal magnitude for compliance with the protocol. For example, at least some protocols that include a normal operation mode and an idle mode place limitations on a magnitude of the output signal while in the idle mode (such as about 10 millivolts (mV)). During the normal operation mode, an input signal received by the communication device includes data. During the idle mode, the input signal does not include data and, in some examples, includes noise. An amplification factor, or gain, of the transmitter while operating in the normal operation mode is sometimes not optimized for operation in the idle mode. Conversely, a gain of the transmitter optimized for operation in the idle mode is sometimes not optimized for operating in the normal operation mode. Thus, a gain optimized for operating in the normal operation mode, in some examples, results in a magnitude of an output signal during the idle mode that exceeds limitations imposed by the communication protocol. Similarly, a gain optimized for operating in the idle mode, in some examples, results in insufficient amplification in the normal operation mode for at least some system implementations.

One approach for addressing the above issues includes shorting positive and negative differential input terminals, or positive and negative differential output terminals, of the transmitter. However, at least some implementations of such an approach introduce potentially undesirable effects into a system. For example, by shorting differential input or output terminals of the transmitter together, parasitic loading is introduced into a signal path of the transmitter. At least partially resulting from this parasitic loading, a bandwidth of the transmitter is reduced or degraded and jitter associated with the transmitter is increased. The reduction in bandwidth and increase in jitter become more greatly pronounced at high data rate communication, such as communication at about 10 gigabits per second (Gbps). Accordingly, benefit of this shorting approach is at least partially limited in high data rate communication such that the approach is generally considered viable at lower data rates, such as data rates of about 5 Gbps or less.

Another approach for addressing the above issues includes implementing a linear redriver as the amplifier of the transmitter. A linear redriver has a gain of one such that the linear redriver does not increase a magnitude of a received input signal. Instead, the linear redriver provides an output signal based on an input signal, where the output signal has substantially a same magnitude as the input signal. This approach is generally considered viable for high data rate communication, such as 10 Gbps. Additionally, a linear redriver, in at least some examples, preserves a shape of an input signal (such as pertaining to pre-cursor and post-cursor) when generating an output signal, thus facilitating support for systems including link training. However, because a linear redriver does not amplify the input signal, in at least some systems a magnitude of the output signal during the normal operation mode does not meet a minimum magnitude requirement of the communication protocol, such as an amplitude of about 400 millivolts mV or a peak to peak voltage of about 800 mV.

One such communication protocol that potentially suffers from the issues described above is Universal Serial Bus (USB). USB is a standard establishing specifications for interconnect cabling, connectors, and communication protocols. As referred to herein, USB refers to any version of the USB specification, including any amendments or supplements, certified by the USB Implementers Forum (USB IF) or any suitable body who replaces and/or aids the USB IF in its role overseeing the USB specification, whether now existing or later developed. In at least one example, USB, as referred to herein, encompasses any one or more of the USB 1.0 specification, USB 2.0 specification, USB 3.0 specification, USB 4.0 specification, USB-C specification, or any derivatives or combinations thereof, such as amended or ".x" variations of the above specifications. In at least some implementations, USB includes a normal operation mode, or mission mode, defined as a U0 mode, and an idle mode, sometimes referred to as electrical idle, defined as a U1 mode.

At least some aspects of the present disclosure provide for an implementation that optimizes transmitter amplification for operating in both a normal operation mode and an idle mode. When the transmitter is receiving an input signal including data, the amplification of the transmitter is configured in a limiting mode. In the limiting mode, the transmitter operates as a high gain redriver that amplifies the input signal to generate the output signal, increasing a magnitude of the input signal to form the output signal. A gain of the transmitter while operating in the limiting mode, in at least one example, is greater than one. When the transmitter is not receiving an input signal that includes data, the amplification of the transmitter is configured in a linear mode. In the linear mode, the transmitter operates as a linear redriver that does not amplify the input signal. A gain of the transmitter while operating in the linear mode, in at least one example, is approximately equal to one such that the output signal is approximately equal to the input signal. In at least some examples, the determination of whether or not the input signal being received includes data is made by a loss of signal detector coupled to differential input terminals of the transmitter. The loss of signal detector, in at least some examples, monitors the differential input terminals and generates a loss of signal indication signal that indicates whether or not the input signal being received includes data. Based on the loss of signal indication signal, operation of the transmitter is selected between the limiting mode and the linear mode.

Referring now to FIG. 1, a block diagram of an illustrative system 100 in accordance with various examples is shown. In at least some examples, the system 100 is representative of a communication system that includes a transmitting device 102 and a receiving device 104. The transmitting device and the receiving device 104 are coupled, or adapted to be coupled, via a conductor 106. In at least some examples, the conductor 106 includes multiple conductive elements such that the conductor 106 is suitable for differential signaling or communication.

The transmitting device 102, in at least some examples, includes a transmitter 108 and a loss of signal detector 110. The transmitter 108, in some examples, includes a limiting driver signal path 112 and a linear driver signal path 114. The transmitting device 102 includes a first input terminal coupled to a node 116 and a second input terminal coupled to a node 118. The first input terminal and the second input terminal are, in at least some implementations, differential input terminals adapted or configured to receive a differential input signal. The transmitter 108 further includes first and second output terminals adapted to couple to the conductor 106, for example, for communicating with the receiving device 104. In at least some examples, the loss of signal detector 110 also includes a first input terminal coupled to the node 116 and a second input terminal coupled to the node 118. An output terminal of the loss of signal detection circuit 110 is coupled to a third input terminal of the transmitter 108.

In an example of operation of the system 100, the loss of signal detection circuit 110 monitors the node 116 and the node 118 to determine whether an input signal, such as a single-ended input signal or a differential input signal, present at the node 116 and/or the node 118 includes data (e.g., whether the input signal is active). Although not illustrated in FIG. 1, in at least some examples the transmitting device 102 includes a processor or other logic circuit that provides the input signal at the node 116 and/or the node 118. When the input signal received at the node 116 or the node 118 does not include data, the loss of signal detection circuit 110 outputs the loss of signal indication signal having a first value (e.g., either a logically asserted value or logically de-asserted value). When the input signal received at the node 116 and/or the node 118 includes data, the loss of signal detection circuit 110 outputs the loss of signal indication signal having a second value (e.g., the other of the logically asserted value or the logically de-asserted value). The loss of signal detection circuit 110, in at least some examples, makes a determination regarding receipt or non-receipt of data in the input signal at the node 116 or the node 118 in a rapid manner, such as in less than about 1 nanosecond. In at least some examples, the rapid determination of the loss of signal detection circuit 110 reduces a chance for bit errors in communication in the system 100. At least one example of a loss of signal detector suitable for implementation as the loss of signal detector 110 is described in U.S. patent application Ser. No. 16/535,557, which was filed Aug. 8, 2019, is titled "Loss of Signal Detection Circuit," and is incorporated herein by reference in its entirety.

The transmitter 108 receives an input signal as present at the node 116 and/or the node 118, processes the input signal, and provides the processed input signal as an output signal at the first and second output terminals of the transmitter 108. The processing of the input signal is at least partially controlled by a value of the loss of signal indication signal. Accordingly, in at least some examples, the transmitter 108 further receives the loss of signal indication signal from the loss of signal detection circuit 110.

Based on a value of the loss of signal indication signal, the transmitter 108 processes the input signal via the limiting driver signal path 112 or the linear driver signal path 114 to generate an output signal. For example, when the loss of signal indication signal indicates that the input signal received at the node 116 and/or the node 118 includes data, the transmitter 108 processes the input signal via the limiting driver signal path 112. Conversely, when the loss of signal indication signal indicates that the input signal received at the node 116 or the node 118 does not include data, the transmitter 108 processes the input signal via the linear driver signal path 114. After generating the output signal, in at least some examples the transmitter 108 transmits the output signal, such as via the conductor 106.

The limiting driver signal path 112, in at least some examples, modifies a magnitude of the input signal to generate the output signal. One example of such a modification is an increase in magnitude such that the limiting driver signal path 112 includes an amplifier, redriver, or other circuitry having a gain greater than one. The modification of the magnitude of the input signal, in at least some examples, generates the output signal having a magnitude greater than a threshold magnitude specified by a communication protocol. In at least some examples, the limiting driver signal path 112 is also, or alternatively, referred to as a high gain signal path.

The linear driver signal path 114, in at least some examples, leaves the magnitude of the input signal substantially unchanged in generating the output signal. For example, in at least some implementations the linear driver signal path 114 includes an amplifier, redriver, or other circuitry having a gain approximately equal to one. The gain approximately equal to one causes the output signal, after having been processed by the transmitter 108 via the linear driver signal path 114, to have approximately a same magnitude as the input signal. In at least some examples, the linear driver signal path 114 is also, or alternatively, referred to as a low gain, or no gain, signal path.

Processing the input signal via the linear driver when data is not being received via the input signal (e.g., such as in an idle mode when only signal noise is present in the input signal) prevents the output signal from having a magnitude greater than permitted by at least some communication protocols in an idle mode. For example, in the absence of dynamically modifying operation of the transmitter 108 based on the loss of signal indication signal, the input signal would be processed via only one of the limiting driver signal path 112 or the linear driver signal path 114. As discussed elsewhere above, such an approach results in potential shortcomings such as under amplification (e.g., less than a threshold) of the input signal when the input signal includes data or over amplification (e.g., greater than a threshold) of the input signal when the input signal does not include data. In at least some examples, one, or both, of these conditions will cause the transmitter 108 and/or the transmitting device 102 to fail certification tests for complying with an applicable communication protocol. By dynamically modifying operation of the transmitter 108 based on the loss of signal indication signal, the transmitting device 102 optimizes a magnitude of the output signal of the transmitter 108 based on contents of the input signal, thereby facilitating compliance of the transmitting device 102 with applicable communication protocols. In at least some examples, the dynamic modification occurs in 1 nanosecond or less.

Figure 2:
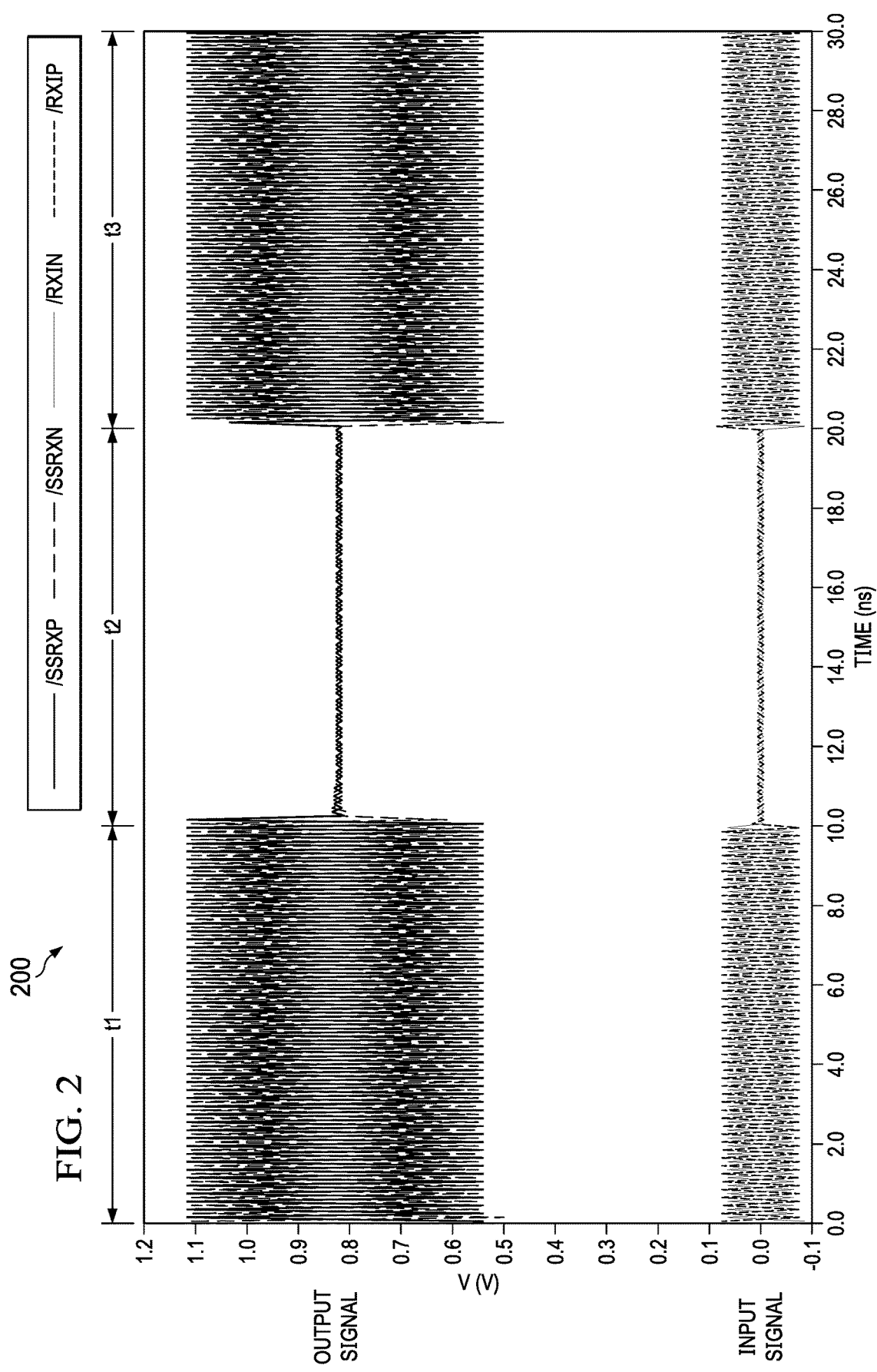
FIG. 2 shows a diagram of illustrative signal waveforms in accordance with various examples.

Referring now to FIG. 2, a diagram 200 of illustrative signal waveforms in accordance with various examples is shown. The diagram 200 illustrates a differential input signal and a differential output signal, such as described above with respect to the system 100. Accordingly, in at least some examples the diagram 200 is representative of signals present in the system 100. For example, the input signal of the diagram 100 includes positive and negative components (shown in FIG. 2 as RXIP and SSRXN, respectively) and corresponds to the input signal received by the system 100 at the node 116 and the node 118, each of the system 100. Similarly, the output signal of the diagram 200 includes positive and negative components (shown in FIG. 2 as SSRXP and SSRXN, respectively) and corresponds to the output signal output by the transmitter 108 of the system 100. In the diagram 200, a horizontal axis represents time in units of ns and the vertical axis represents voltage in units of volts.

As shown by the diagram 200, during a time period illustrated as t1 (also illustrated, later in time, as t3), the input signal includes data. During t1 (and t3), this data causes a magnitude of the input signal to be greater than when the input signal does not include data, such as during the time period illustrated as t2. In at least some examples, the input signal can be said to be active during the time periods t1 and t3 when the input signal includes data. As further shown by the diagram 200, during t2 the input signal does not include data. This lack of data causes a magnitude of the input signal to decrease. In at least some examples, during t2 the input signal includes only signal noise, or signal noise makes up a majority of a voltage component of the input signal.

During t1 and t3, the loss of signal indication signal, as described above with respect to the system 100, indicates that the input signal includes data and the transmitter 108 processes the input signal via the limiting driver signal path 112. As further shown by the diagram 200, during t1 and t3 the processing of the input signal via the limiting driver signal path 112 causes a magnitude of the input signal to increase to form the output signal. During t2, the loss of signal indication signal indicates that the input signal does not include data and the transmitter 108 processes the input signal via the linear driver signal path 114. As further shown by the diagram 200, during t2 the processing of the input signal via the linear driver signal path 112 causes a magnitude of the output signal to remain substantially the same as a magnitude of the input signal (e.g., resulting from a gain of 1 of the linear driver signal path 114).

Figure 3:
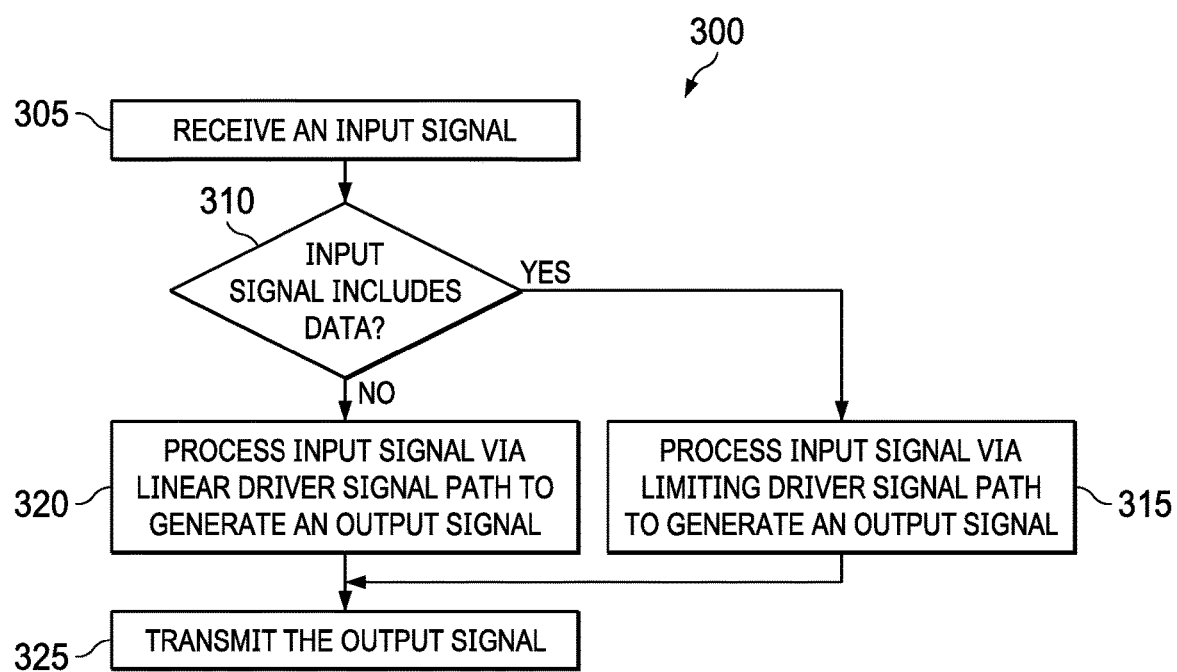
FIG. 3 shows a flowchart of an illustrative method in accordance with various examples.

Referring now to FIG. 3, a flowchart of an illustrative method 300 in accordance with various examples is shown. At least some implementations of the method 300 are representative of at least some operations of the transmitting device 102 of the system 100. Accordingly, the method 300 is suitable for implementation in at least some examples of the system 100, and reference is made in describing the method 300 to components and/or signals of the system 100.

At operation 305, an input signal is received. In some examples, the input signal is a single-ended signal. In other examples, the input signal is a differential signal. Additionally, in at least some examples, the input signal is communicated according to a USB standard and/or communication protocol. The input signal is, in some example, in an active state or mode (e.g., such that the input signal includes data) or in an inactive state or mode (e.g., such that the input signal does not include data).

At operation 310, the input signal is analyzed to determine whether the input signal includes data. In at least some examples, the input signal is analyzed by a loss of signal detector or loss of signal detection circuit, such as the loss of signal detection circuit 110. Based on the analysis, a loss of signal indication signal is generated indicating whether the input signal includes data. When the input signal includes data, the method 300 proceeds to operation 315.

At operation 315, the transmitter 108 processes the input signal via the limiting driver signal path 112 to generate an output signal. In at least some examples, the limiting driver signal path 112 is a high gain signal path that increases a magnitude of the input signal to generate an output signal. After generating the output signal, the method 300 proceeds to operation 325.

Returning to operation 310, when the input signal does not include data, the method 300 proceeds to operation 320. At operation 320, the transmitter 108 processes the input signal via the linear driver signal path 114 to generate the output signal. In at least some examples, the linear driver signal path 114 is a low gain (or no gain) signal path that generate an output signal having a magnitude approximately equal to a magnitude of the input signal. After generating the output signal, the method 300 proceeds to operation 325.

At operation 325, the transmitter outputs or transmits the output signal. The transmission is, in some examples, a transmission to another device such as the receiving device 104 via the conductor 106. In other examples, the transmission is to another component internal to the transmitting device 102, such as via printed circuit board traces.

While the operations of the method 300 have been discussed and labeled with numerical reference, in various examples the method 300 includes additional operations that are not recited herein (e.g., such as intermediary comparisons, logical operations, processing, signal selections such as via a multiplexer, etc.). In some examples, any one or more of the operations recited herein includes one or more sub-operations (e.g., such as intermediary comparisons, logical operations, signal selections such as via a multiplexer, etc.). In some examples, any one or more of the operations recited herein is omitted, and/or in some examples any one or more of the operations recited herein is performed in an order other than that presented herein (e.g., in a reverse order, substantially simultaneously, overlapping, etc.). All of these alternatives are intended to fall within the scope of the present disclosure.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, drain-extended, natural, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a loss of signal detection circuit configured to:
      receive an input signal;
      determine whether the input signal includes data; and
      output a loss of signal indication signal indicating whether the input signal includes data; and
   a transmitter coupled to the loss of signal detection circuit, wherein the transmitter is configured to:
      receive the input signal;
      process the input signal according to a limiting driver signal path to generate an output signal when the loss of signal indication signal indicates that the input signal includes data; and
      process the input signal according to a linear driver signal path to generate the output signal when the loss of signal indication signal indicates that the input signal does not include data.

2. The circuit of claim 1, wherein the limiting driver signal path includes a high-gain amplifier having a gain of greater than one.

3. The circuit of claim 1, wherein the linear driver signal path includes an amplifier having a gain of one.

4. The circuit of claim 1, wherein the loss of signal detection circuit generates and outputs the loss of signal indication signal within 1 nanosecond.

5. The circuit of claim 1, wherein a magnitude of the output signal when generated according to the linear driver signal path is less than 10 millivolts.

6. The circuit of claim 1, wherein a magnitude of the output signal when generated according to the linear driver signal path is greater than 800 millivolts.

7. A circuit, comprising:
   a transmitter configured to:
      receive an input signal and a loss of signal indication signal; and
      dynamically modify processing of the input signal based on the loss of signal indication signal by:
         processing the input signal via a limiting driver signal path to generate an output signal when the loss of signal indication signal has a first value; and
         processing the input signal via a linear driver signal path to generate the output signal when the loss of signal indication signal has a second value.

8. The circuit of claim 7, further comprising a loss of signal detection circuit configured to:
   receive the input signal;
   analyze the input signal to determine whether the input signal includes data; and generate and output the loss of signal indication signal indicating whether the input signal includes data.

9. The circuit of claim 7, wherein the limiting driver signal path includes a high-gain amplifier having a gain of greater than one.

10. The circuit of claim 7, wherein the linear driver signal path includes am amplifier having a gain of one.

11. The circuit of claim 7, wherein the loss of signal detection circuit generates and outputs the loss of signal indication signal within 1 nanosecond.

12. The circuit of claim 7, wherein a magnitude of the output signal when generated according to the linear driver signal path is less than 10 millivolts.

13. The circuit of claim 7, wherein the transmitter is further configured to transmit the output signal after generating the output signal by dynamically modifying processing of the input signal based on the loss of signal indication signal.

14. A method, comprising:
receiving an input signal and a loss of signal indication signal; and
dynamically modifying processing of the input signal based on the loss of signal indication signal by:
  processing the input signal via a limiting driver signal path to generate an output signal when the loss of signal indication signal has a first value; and
  processing the input signal via a linear driver signal path to generate the output signal when the loss of signal indication signal has a second value.

15. The method of claim 14, further comprising:
analyzing the input signal to determine whether the input signal includes data; and
generating and outputting the loss of signal indication signal indicating whether the input signal includes data.

16. The method of claim 15, the loss of signal indication signal is generated and output within 1 nanosecond of receipt of the input signal.

17. The method of claim 14, further comprising transmitting the output signal after generating the output signal by dynamically modifying processing of the input signal based on the loss of signal indication signal.

18. The method of claim 14, wherein the limiting driver signal path includes a high-gain amplifier having a gain of greater than one.

19. The method of claim 14, wherein the linear driver signal path includes an amplifier having a gain of one.

20. The method of claim 14, wherein a magnitude of the output signal when generated according to the linear driver signal path is less than 10 millivolts.

* * * * *